United States Patent
Amir

(10) Patent No.: US 6,555,761 B2
(45) Date of Patent: Apr. 29, 2003

(54) PRINTED CIRCUIT BOARD WITH SOLDER-FILLED VIA

(75) Inventor: Dudi Amir, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 09/751,946

(22) Filed: Dec. 29, 2000

(65) Prior Publication Data

US 2002/0084108 A1 Jul. 4, 2002

(51) Int. Cl.$^7$ .................. H01R 12/04; H05K 1/11
(52) U.S. Cl. .................. 174/263; 29/846; 29/852
(58) Field of Search ................. 174/262–266; 29/846, 852; 361/792–795

(56) References Cited

U.S. PATENT DOCUMENTS

| | | | | |
|---|---|---|---|---|
| 4,700,473 A | * | 10/1987 | Freyman et al. | ............... 29/846 |
| 5,229,550 A | * | 7/1993 | Bindra et al. | ................ 174/262 |
| 5,463,191 A | * | 10/1995 | Bell et al. | .................... 174/263 |
| 5,764,485 A | * | 6/1998 | Lebaschi | .................... 361/774 |
| 6,252,178 B1 | * | 6/2001 | Hashemi | ..................... 174/260 |

* cited by examiner

*Primary Examiner*—Albert W. Paladini
*Assistant Examiner*—Jeremy Norris
(74) *Attorney, Agent, or Firm*—Schwegman, Lundberg, Woessner & Kluth, P.A.

(57) ABSTRACT

A plated-through hole via is substantially filled with solder rather than with traditional polymer to reduce printed circuit board failure due to outgassing from improperly cured polymer via fill. The solder via fill is in some embodiments eutectic or high-temperature solder, and in some further embodiments is capped at least one end with a barrier.

17 Claims, 1 Drawing Sheet

PRINTED CIRCUIT BOARD WITH SOLDER-FILLED VIA

FIELD OF THE INVENTION

The invention relates generally to electronic printed circuit boards, and more specifically to via filling with solder in printed circuit boards.

BACKGROUND OF THE INVENTION

Electronic components are typically assembled into complex circuits by mounting them on printed circuit boards. These printed circuit boards are usually flat nonconductive boards with one or more layers of a conductive material such as copper fixed on or in the printed circuit board. The layers of copper are etched or otherwise formed to specific shapes and patterns in the manufacturing process, such that the remaining conductive copper traces are routed to connect electrical components to be attached to the printed circuit board.

It is not uncommon for printed circuit boards such as these to have copper layers on both a top and bottom side of the circuit board, but also several layers of copper traces or patterns sandwiched at various depths within the circuit board itself. These traces allow greater flexibility in circuit routing, and usually allow designing a more compact circuit board for a particular circuit than would otherwise be possible. The various layers are sometimes dedicated to particular purposes, such as a ground layer that only serves to distribute ground or signal return connections to various components.

Multiple layers that serve to connect components to other components often must be connected to components attached to a different layer (top or bottom) or the layers must be attached to each other at selected points, requiring use of what are commonly known as vias. These vias typically are essentially small conductive plated-through hole elements oriented perpendicular to the top and bottom surfaces of a circuit board that extend through at least two conductive layers of the circuit board, and that electrically connect circuit traces on at least two of the conductive layers to each other.

Each of these plated-through hole-type vias are first formed as a copper plated-through hole using technology such as is commonly used to produce plated-through holes for receiving electronic component leads. The plated-through hole via is then filled with a polymer and capped at each end with a metal cap, forming a closed cylinder filled with polymer. The completed cylindrical via extends through at least two layers of a multi-layer circuit board, and typically has connections to electrical traces or conductors on at least two different levels of the circuit board.

But, creating vias in this manner requires accurate and complete curing of the polymers used to fill the plated-through vias. Otherwise, outgassing of improperly cured polymer can cause the circuit board to fail. In some applications with large circuit boards and fine-pitch vias and traces, nearly half of all produced circuit boards have been scrapped due to outgassing problems with circuit board via polymers that were less than ideally cured.

One solution is to replace plated-through hole-type vias with solid metallic microvias formed using laser technology and solid metal injected into the laser-drilled via hole. This method works well, but requires additional equipment and increases the cost of via production of a typical printed circuit board from about $10 to $45–50 per board.

What is needed is a method of creating a via using existing technology and equipment that eliminates the outgassing problems associated with polymer-filled plated-through hole vias.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

A need exists for a method of creating vias using existing technology and equipment that deals with the problems associated with outgassing from improperly cured polymers in traditional polymer-filled plated-through vias. The present invention addresses this problem by using existing equipment such as solder printing equipment to substantially fill plated-through hole vias with solder.

Figure 1:
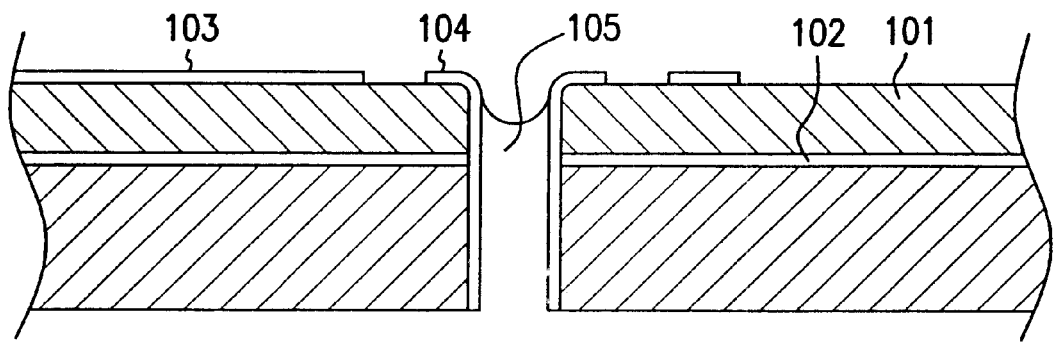
FIG. 1 shows a printed circuit board with a polymer-filled via, consistent with the prior art.

Because vias must be filled to support placement of surface-mount solder balls and for other reasons in various applications, most prior multi-layer printed circuit boards contain plated-through holes filled with a polymer as shown in FIG. 1. Printed circuit board 011 is typically made of a nonconductive material such as fiberglass, and has several layers of copper conductive traces such as internal layer 102 and surface layer 103. Plated-through hole via 104 is in electrical contact with at least one copper trace on a copper layer, and serves to provide electrical connection between layers. The plated-through hole is filled with a polymer 105, so that a solder bump may be printed over the surface layer of the copper plated-through hole 104 to provide electrical connection to surface-mounted components.

The polymers 105 are cured after insertion into the plated-through hole, resulting in emission of corrosive gases or outgassing. The effects of such outgassing can be controlled if the polymer is properly cured during initial production, but uncured polymer via fill material can cause circuit board failure during or after manufacture. Specifically, outgassing has been problematic when incompletely cured polymer via fill material is heated in soldering, rework, or other circuit board manufacturing or populating stages subsequent to the polymer fill and cure.

Although this outgassing can be eliminated by not using plated-through hole vias filled with these polymers, the only current method of doing this is to fill a laser-drilled hole with copper or other conductive material. This requires expensive new equipment and training, resulting in an estimated cost of $45–50 for a circuit board that would cost only $10 using traditional equipment.

Figure 2:
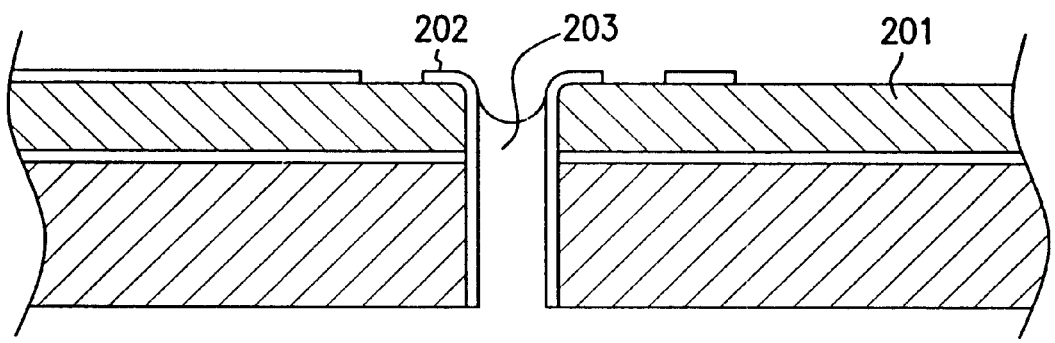
FIG. 2 shows a printed circuit board with a solder-filled via, consistent with an embodiment of the present invention.

The present invention utilizes only equipment currently commonly used in printed circuit board production to eliminate the need for polymer filling of plated-through hole vias, incorporating solder printing equipment to fill the plated-through hole vias with solder rather than polymer. FIG. 2 illustrates a printed circuit board 201 with a plated-through hole via 202. The plated-through hole via is filled in the pictured embodiment of the invention with solder 203, which is used to fill the plated-through hole via in much the same way as polymer 105 in prior art FIG. 1.

The solder filling process can be completed using only standard printed circuit board manufacturing equipment, such as by using one or more solder printing passes at the location of the plated-through hole to fill the hole with solder. This solder printing equipment is commonly used to print solder onto pads for surface mount components, and is typically a part of most current printed circuit board production processes.

Figure 3:
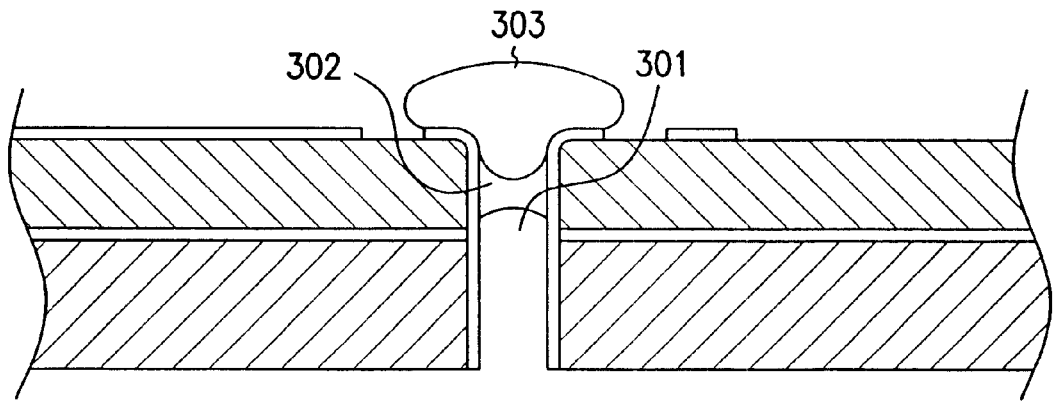
FIG. 3 shows a printed circuit board with a solder filled via having a barier and BGA ball, consistent with an embodiment of the present invention.

The printed solder used to fill the vias may be eutectic solder, or some higher melting pint solder in various embodiments of the invention. One embodiment of the invention as shown in FIG. 3 employed high-temperature solder 301 as via fill material with a barrier of solder paste 302 placed on top of the via-fill solder before a Ball-Grid Array (BGA) solder ball 303 was printed on top of the via. This resulted in the solder paste barrier moving down within the via, which may result in undesirable reduction or disappearance of the BGA solder ball in some circumstances. Also, some visual evidence suggests the barrier in this particular example embodiment may not have been effective in this particular embodiment in keeping the BGA ball solder and the via solder from mixing and forming a new, unintended solder alloy.

Another example embodiment of the invention uses double surface-mount printing to fill the vias with the same type of solder as will be used in other surface printing or BGA solder ball placement, potentially reducing the solder alloy mixing or solder barrier migration or failure concerns with some other embodiments. It is anticipated that a variety of other combinations of solder alloys and use of barriers will be used in other embodiments of the invention and will be found to have economic or physical advantages, all of which are within the scope of the invention.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A printed circuit board via, comprising:

a plated-through hole;

solder, substantially filling the plated-through hole; and a cap covering the solder-filled plated-through hole via, the cap comprising a material other than solder.

2. The printed circuit board via of claim 1, the plated-through hole comprising a copper plated-through hole.

3. The printed circuit board via of claim 1, the solder comprising eutectic solder.

4. The printed circuit board via of claim 1, the solder comprising high-temperature solder.

5. The printed circuit board via of claim 1, the cap comprising a polymer.

6. A method of making a printed circuit board via, comprising:

forming a plated-through hole;

substantially filling the plated-through hole via with solder; and sealing the solder-filled plated-through hole via with a cap comprising a material other than solder.

7. The method of claim 6, wherein the formed plated-through hole is a copper plated-through. hole.

8. The method of claim 6, wherein the solder that substantially fills the plated-through hole is eutectic solder.

9. The method of claim 6, wherein the solder that substantially fills the plated-through hole is high-temperature solder.

10. The method of claim 6, wherein substantially filling the plated-through hole with solder comprises performing at least one solder printing pass.

11. The method of claim 6, wherein the cap comprises a polymer.

12. A printed circuit board, comprising:

at least one plated-through hole via that is substantially filled with solder and that is capped with a material other than solder.

13. The printed circuit board of claim 12, the plated-through hole comprising a copper plated-through hole.

14. The printed circuit board of claim 12, the solder comprising eutectic solder.

15. The printed circuit board of claim 12, the solder comprising high-temperature solder.

16. The printed circuit board of claim 12, wherein the capping material comprises a polymer.

17. The printed circuit board of claim 12, wherein the at least one plated-through hole via is substantially filled with solder by at least one solder printing pass.

* * * * *